(12) United States Patent
Yamamoto

(10) Patent No.: US 6,404,219 B1
(45) Date of Patent: *Jun. 11, 2002

(54) BURN-IN TEST METHOD FOR A SEMICONDUCTOR CHIP AND BURN-IN TEST APPARATUS THEREFOR

(75) Inventor: Shigehisa Yamamoto, Tokyo (JP)

(73) Assignee: Mitsubishi Denki Kabushiki Kaisha, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/309,907

(22) Filed: May 11, 1999

(30) Foreign Application Priority Data

Dec. 7, 1998  (JP) ............................. 10-346829

(51) Int. Cl.⁷ ................................... G01R 31/28
(52) U.S. Cl. ........................ 324/765; 324/760
(58) Field of Search ................. 324/158.1, 765, 324/760, 537; 365/201; 714/718, 721

(56) References Cited

U.S. PATENT DOCUMENTS

| | | | | |
|---|---|---|---|---|
| 3,870,953 A | * | 3/1975 | Boatman et al. | 324/537 |
| 4,743,847 A | * | 5/1988 | Frushour | 324/537 |
| 5,995,428 A | * | 11/1999 | Chien et al. | 365/201 |
| 5,999,007 A | * | 12/1999 | Kimura | 324/760 |

FOREIGN PATENT DOCUMENTS

| | | |
|---|---|---|
| JP | 53-84685 | 7/1978 |
| JP | 4-98845 | 3/1992 |
| JP | 9-127189 | 5/1997 |

* cited by examiner

Primary Examiner—Ernest Karlsen
(74) Attorney, Agent, or Firm—McDermott, Will & Emery

(57) ABSTRACT

A burn-in test method and apparatus and a semiconductor chip to be used in a burn-in test method that allow current stress to be imposed on every circuit node by varying a power supply voltage in pulse form, and thereby enables an efficient burn-in test. A burn-in test is performed efficiently by imposing current stress to every internal circuit by supplying the internal circuits of a semiconductor chip with a pulse Vcc voltage that varies from 0 V to a burn-in voltage Vbi. The burn-in test time can further be shortened by varying the Vcc voltage in pulse form in a range from a voltage that is higher than or equal to the threshold voltage Vth to the burn-in voltage Vbi or by setting the pulse waveform of the Vcc voltage in such a manner that a high-voltage period $T_H$ is longer than a low-voltage period $T_L$.

12 Claims, 10 Drawing Sheets

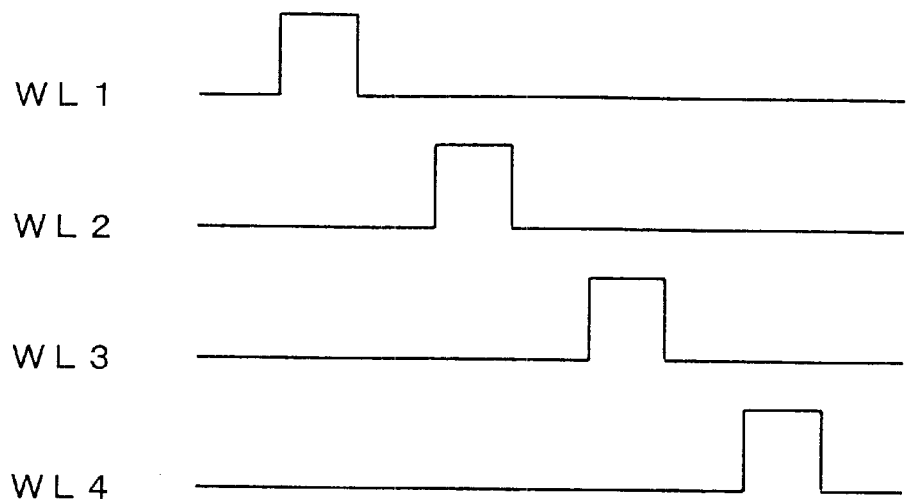
FIG. 1 3 (PRIOR ART)
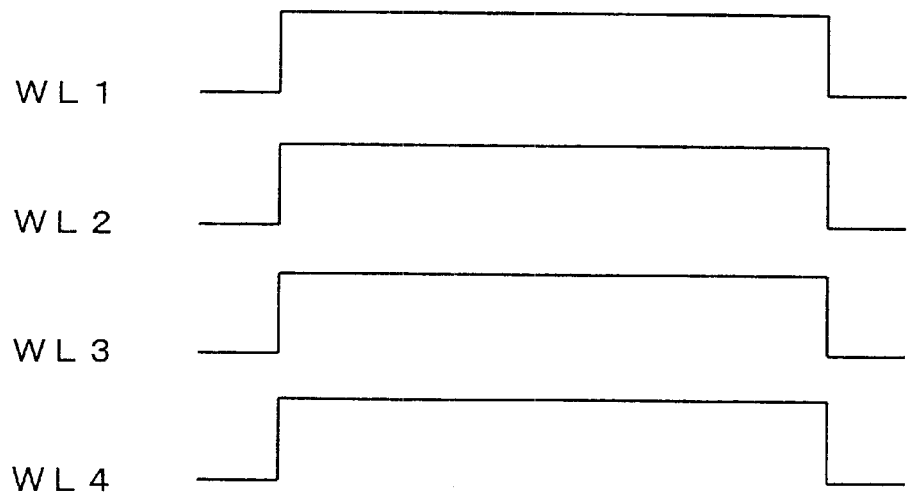
FIG. 1 4 (PRIOR ART)

BURN-IN TEST METHOD FOR A SEMICONDUCTOR CHIP AND BURN-IN TEST APPARATUS THEREFOR

BACKGROUND OF THE INVENTION

1. Field of the Invention

The present invention relates to a burn-in test method for a semiconductor chip, a burn-in test apparatus, and a semiconductor chip to be used in a burn-in test method.

2. Description of Related Art

The burn-in test of a semiconductor chip is an accelerated life test for screening semiconductor chips having an initial failure or semiconductor chips that are out of the distribution range of a variation in the quality of manufacture by applying, to semiconductor chips, higher voltage, higher temperature stress than in actual use conditions.

In a conventional burn-in test method, first, after a wafer test, non-defective devices are subjected to assembling and rendered in a package-level state in which each device is sealed in a ceramic package or a plastic package. Then, a burn-in test is performed in such a manner that in a thermostatic chamber a number of chips are placed on a burn-in board and burn-in stress is imposed on those chips en bloc. There is another type of burn-in test method that is performed in a wafer-level state. In this burn-in test method, stress is imposed on non-defective devices in a wafer state, that is, before being subjected to assembling and sealed in a package.

FIG. 11 shows a conventional burn-in test apparatus. In FIG. 11, reference numeral 1 denotes a burn-in apparatus having a signal input device 20 and a DC power supply device 21; 2, a prober; 3, a wafer to be mounted on a hot chuck (not shown) of the prober 2; 10, semiconductor chips formed on the wafer 3; 6, a probe card to be connected to the semiconductor chips 10; 4, a thermostatic chamber; 5, a burn-in circuit board provided in the thermostatic chamber 4; and 7, power/signal lines that connect the burn-in apparatus 1 to the prober 2 and the burn-in circuit board 5. In this specification, the entire apparatus constituted of the burn-in apparatus 1, the prober 2, the thermostatic chamber 4, and the power/signal lines 7 is called a burn-in test apparatus.

A wafer burn-in test is performed by supplying power supply voltages and a signal from the burn-in apparatus 1 to the semiconductor chips 10 on the wafer 3 via the power/signal lines 7 that are connected to the probe card 6. A package burn-in test is performed in such a manner that the semiconductor chips 10 are mounted on the burn-in circuit board 5 and power supply voltages and a signal are supplied via the power/signal lines 7.

FIG. 12 is a circuit diagram of a DRAM memory cell circuit. As shown in FIG. 12, each DRAM memory cell is composed of a word line WL1 or the like, a bit line BL1 or the like, a switching transistor T1 or the like, and a memory capacitor C1 or the like.

FIG. 13 is an example time chart showing waveforms of burn-in stress to be imposed on the DRAM memory cell circuit of FIG. 12. As shown in FIG. 13, the potentials of the word lines WL1–WL4 are caused to rise one by one in order, whereby stress is imposed on the gate oxide films etc. of the switching transistors T1 etc.

FIG. 14 is an example time chart showing waveforms of burn-in stress for causing the potentials of the word lines WL1–WL4 to rise collectively to shorten the evaluation time of a wafer burn-in test. As shown in FIG. 14, the degree of acceleration of an accelerated life test can be made higher by increasing the memory cell selection ratio by increasing the number of switching transistors T1 etc. on which stress can be imposed. The selection ratio means the number of selected memory cells per unit time.

However, random logic devices have a problem that because of a large memory cell selection ratio in an actual operation state, a high degree of acceleration is not expected even if the memory cell selection ratio is increased, unlike the case of memory devices such as the above-described memory cell circuit.

In logic devices whose operation speeds are now being increased, it is necessary to reinforce screening of current-mode failures in addition to voltage-mode failures. Current stress is imposed in the form of a charge/discharge current when a signal changes from "H" to "L" or from "L" to "H." However, since burn-in test vectors are restricted in the kinds of input patterns and expected value patterns, it is difficult to perform a burn-in test by using a test pattern that enables a charge/discharge operation in every circuit. Therefore, in a burn-in test, a charge/discharge operation occurs only in part of the circuits and there are circuits on which current stress is not imposed. This results in a problem that the burn-in efficiency is not sufficiently high.

SUMMARY OF THE INVENTION

The present invention has been made to solve the above problems in the art, and an object of the invention is therefore to provide a burn-in test method and apparatus and a semiconductor chip to be used in a burn-in test method that allow current stress to be imposed on every circuit node by varying a power supply voltage in pulse form, and thereby enables an efficient burn-in test.

According to a first aspect of the present invention, there is provided a burn-in test method for a semiconductor chip, comprising: a pulse voltage supplying step of supplying an inverter circuit in a semiconductor chip with a pulse voltage that is output from a pulsed power supply device and varies in a range from 0 V to a burn-in voltage; a charge/discharge step of charging a load capacitor of an internal circuit of the semiconductor chip by using the pulse voltage if an input signal supplied to the semiconductor chip is at the burn-in voltage, and discharging the load capacitor by using the pulse voltage if the input signal is at 0 V; and a step of imposing current stress on the internal circuit by using a current generated in the charge/discharge step.

According to a second aspect of the present invention, there is provided a burn-in test apparatus comprising: a burn-in apparatus having a pulsed power supply device for supplying a pulse voltage that varies in pulse form in a range from 0 V to a burn-in voltage; and a semiconductor chip that is supplied with the pulse voltage from the pulsed power supply device, wherein the semiconductor chip has an internal circuit and a load capacitor in the internal circuit, the internal circuit being given current stress in such a manner that a current is caused to flow through the internal circuit by charging the load capacitor when an input signal supplied to the semiconductor chip is at the burn-in voltage, and discharging the load capacitor when the input signal is at 0V.

According to a third aspect of the present invention, there is provided a burn-in test apparatus comprising: a burn-in apparatus having: a plurality of DC power supply devices for supplying respective DC voltages; and a burn-in control signal generation device for generating a burn-in control signal to be used for selecting one of the DC power supply devices; and a semiconductor chip that is supplied with the DC voltages from the respective DC power supply devices, the semiconductor chip having: a plurality of pulsed power supply devices for supplying respective pulse voltages that vary in pulse form in a range from 0 V to a burn-in voltage; an addition section for generating a plurality of pulse supply voltages by adding the DC voltages to the pulse voltages, respectively; a selection circuit for selecting one of the pulse supply voltages generated by the addition section in accordance with the burn-in control signal; and an internal circuit including a load capacitor, wherein the internal circuit being given current stress in such a manner that a current is caused to flow through the internal circuit by charging the load capacitor by using the selected pulse supply voltage when an input signal supplied to the semiconductor chip is at the burn-in voltage, and discharging the load capacitor by using the pulse supply voltage when the input signal is at 0 V.

According to a fourth aspect of the present invention, there is provided a burn-in test method for a semiconductor chip, comprising: a DC voltage supplying step of supplying DC voltages that are output from a plurality of DC power supply devices, respectively; a pulse voltage supplying step of causing a plurality of pulsed power supply devices in the semiconductor chip to output respective pulse voltages that vary in a range from 0 V to a burn-in voltage; a step of generating a plurality of pulse supply voltages by adding the DC voltages to the pulse voltages, respectively; a step of selecting one of the pulse supply voltages in accordance with a control signal that is input to the semiconductor chip; a charge/discharge step of charging a load capacitor of an internal circuit of the semiconductor chip by using the selected pulse supply voltage when an input signal supplied to the semiconductor chip is at the burn-in voltage, and discharging the load capacitor by using the pulse supply voltage when the input signal is at 0 V; and a step of imposing current stress on the internal circuit by using a current generated in the charge/discharge step.

According to a fifth aspect of the present invention, there is provided a semiconductor chip to be used in a burn-in test method in which a pulse voltage that varies in pulse form in a range from 0 V to a burn-in voltage is supplied, the semiconductor chip having an internal circuit including a load capacitor, the internal circuit being given current stress in such a manner that a current is caused to flow through the internal circuit by charging the load capacitor when an input signal supplied to the semiconductor chip is at the burn-in voltage, and discharging the load capacitor when the input signal is at 0 V.

According to a sixth aspect of the present invention, there is provided a semiconductor chip to be used in a burn-in test method in which the semiconductor chip is supplied with respective DC voltages from a plurality of DC power supply devices, the semiconductor chip comprising: a plurality of pulsed power supply devices for supplying respective pulse voltages that vary in pulse form in a range from 0 V to a burn-in voltage; an addition section for generating a plurality of pulse supply voltages by adding the DC voltages to the pulse voltages, respectively; a selection circuit for selecting one of the pulse supply voltages generated by the addition section in accordance with an input burn-in control signal; and an internal circuit having a load capacitor, the internal circuit being given current stress in such a manner that a current is caused to flow through the internal circuit by charging the load capacitor by using the selected pulse supply voltage if an input signal supplied to the semiconductor chip is at the burn-in voltage, and discharging the load capacitor by using the pulse supply voltage if the input signal is at 0 V.

The above and other objects, effects, features and advantages of the resent invention will become more apparent from the following description of he embodiments thereof taken in conjunction with the accompanying drawings.

BRIEF DESCRIPTION OF THE DRAWINGS

FIG. 13 is an example time chart showing waveforms of burn-in stress to be imposed on the DRAM memory cell circuit of FIG. 12.

FIG. 14 is an example time chart showing waveforms of burn-in stress for causing the potentials of the word lines WL1–WL4 to rise collectively to shorten the evaluation time of a wafer burn-in test.

DETAILED DESCRIPTION OF THE PREFERRED EMBODIMENTS

Figure 1:
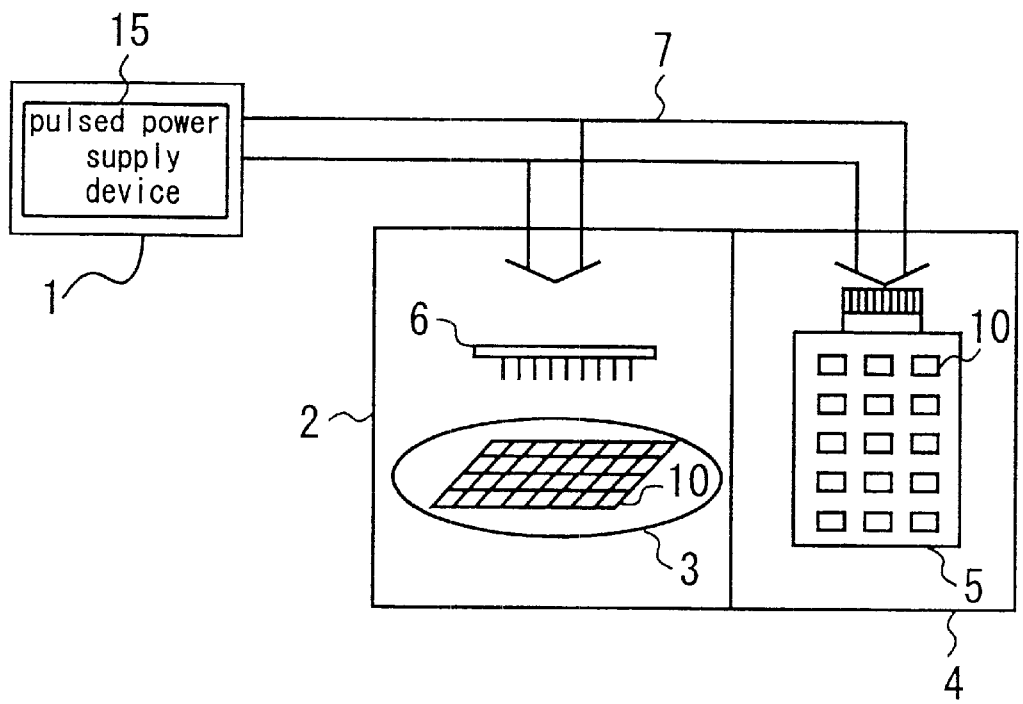
FIG. 1 shows a burn-in test apparatus according to a embodiment 1 of the invention.

Embodiments of the present invention will be described below with reference to the accompanying drawings. It is noted that the same reference symbols in the drawings denote the same or corresponding components.

Embodiment 1

FIG. 1 shows a burn-in test apparatus according to a embodiment 1 of the invention. In FIG. 1, reference numeral 1 denotes a burn-in apparatus having a pulsed power supply device 15; 2, a prober; 3, a wafer to be mounted on a hot chuck (not shown) of the prober 2; 10, semiconductor chips formed on the wafer 3; 6, a probe card that supplies power supply voltages and a signal to the semiconductor chips 10 on the wafer 3 from the burn-in apparatus 1 via power/signal lines 7; 4, a thermostatic chamber; and 5, a burn-in circuit board provided in the thermostatic chamber 4. Reference numeral 10 also denotes semiconductor chips provided on the burn-in circuit board 5.

Figure 2:
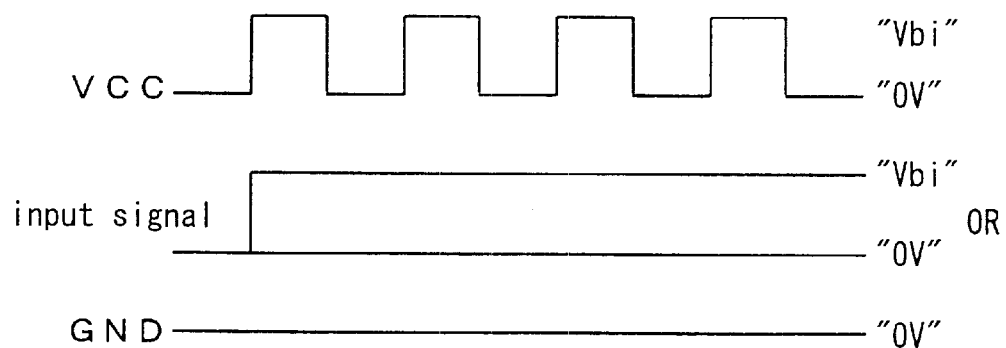
FIG. 2 is a time chart showing waveforms of power supply voltages and a signal that are supplied from the burn-in apparatus 1 of the embodiment 1.

FIG. 2 is a time chart showing waveforms of power supply voltages and a signal that are supplied from the burn-in apparatus 1 of the embodiment 1. As shown in FIG. 2, a GND voltage is fixed at 0 V and an input signal is fixed at 0 V or a burn-in voltage Vbi. A Vcc voltage is a pulse voltage ranging from 0 V to the burn-in voltage Vbi.

Figure 3:
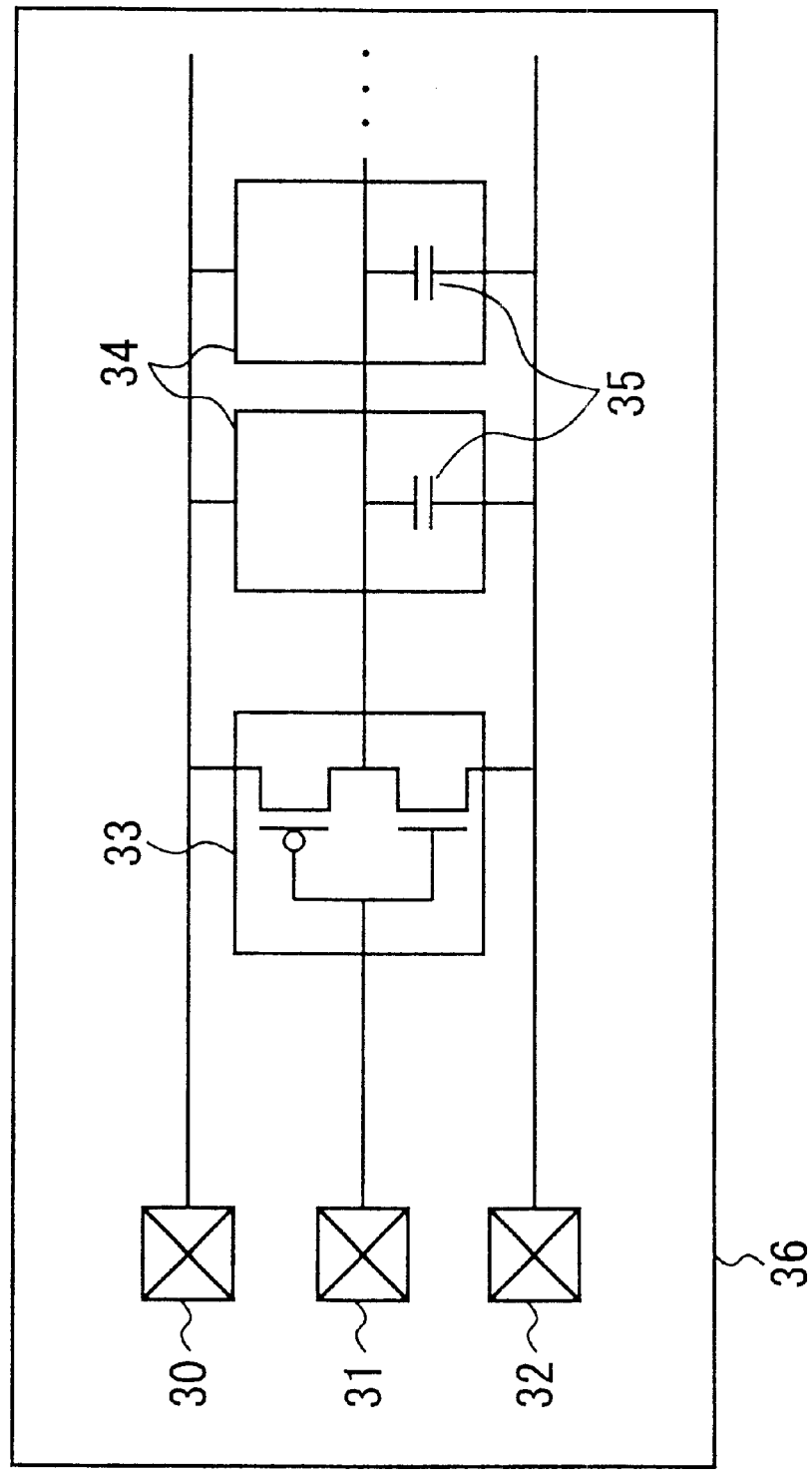
FIG. 3 schematically shows a semiconductor chip circuit to be used in the burn-in test apparatus of the embodiment 1.

FIG. 3 schematically shows a semiconductor chip circuit to be used in the burn-in test apparatus of the embodiment 1. As shown in FIG. 3, power supply voltages and a signal are supplied, via a Vcc voltage pad 30, a GND voltage pad 32, and an input signal pad 31, respectively, to an inverter circuit 33 and internal circuits 34. Because the Vcc voltage is supplied in pulse form, a load capacitor 35 that is constituted of a gate capacitance, a wiring capacitance, and a junction capacitance is charged (if the input signal is at Vbi) or discharged (if the input signal is at 0 V) at rises and falls of pulses, whereby a current flows through a wiring that constitutes each internal circuit 34. Since every internal circuit 34 is supplied with the Vcc voltage and the GND voltage, the supply of the pulse Vcc voltage allows current stress to be imposed on every internal circuit 34. This enables an efficient burn-in test.

As described above, the embodiment 1 makes it possible to impose current stress to every internal circuit 34 by supplying the internal circuits 34 with the pulse Vcc voltage ranging from 0 V to the burn-in voltage Vbi, and thereby enables an efficient burn-in test.

Embodiment 2

A burn-in test method according to a embodiment 2 of the invention will be described below by using the burn-in apparatus 1 and the semiconductor chip circuit 36 of the embodiment 1 and the time chart of FIG. 2 showing the waveforms of the power supply voltages and the signal.

The Vcc voltage is supplied from the pulsed power supply device 15 of the burn-in apparatus 1 to the semiconductor chip circuit 36 so as to be varied in pulse form. The input signal to the semiconductor chip circuit 36 is fixed at the burn-in voltage Vbi or 0 V and the GND voltage is fixed at 0 V. In the semiconductor chip circuit 36, the received pulse Vcc voltage is supplied to the internal circuits 34 via the inverter circuit 33. The inverter circuit 33 charges the load capacitor 35 of each internal circuit 34 if the input signal is at Vbi and discharges it if the input signal is at 0 V. As a result, a current flows through the wiring that constitutes each internal circuit 34. Since every internal circuit 34 is supplied with the Vcc voltage and the GND voltage, the supply of the pulse Vcc voltage allows current stress to be imposed on every internal circuit 34. This enables an efficient burn-in test.

A wafer burn-in test can be performed in such a manner that power supply voltages and a signal are supplied from the burn-in apparatus 1 to the semiconductor chips 10 on the wafer 3 via the power/signal lines 7 and the probe card 6. A package burn-in test can be performed in such a manner that the semiconductor chips 10 are mounted on the burn-in circuit board 5 and power supply voltages and a signal are supplied via the power/signal lines 7.

As described above, the embodiment 2 makes it possible to impose current stress to every internal circuit 34 by supplying the internal circuits 34 with the pulse Vcc voltage ranging from 0 V to the burn-in voltage Vbi, and thereby enables an efficient burn-in test.

Embodiment 3

Figure 4:
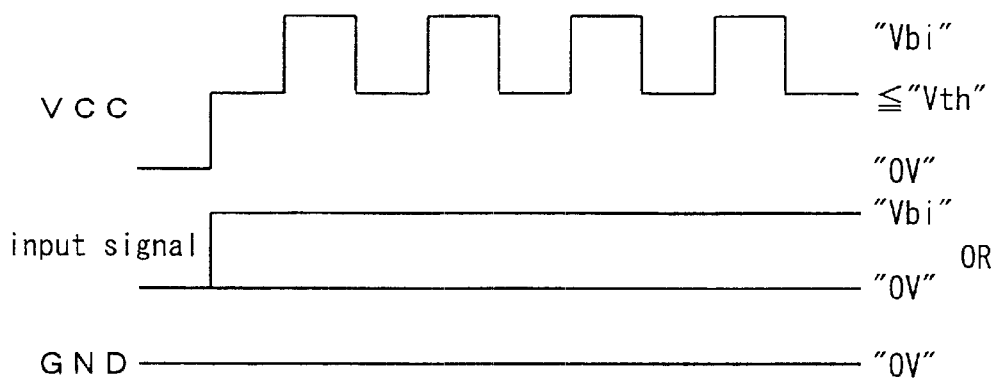
FIG. 4 is a time chart according to a embodiment 3 of the invention.

FIG. 4 is a time chart according to a embodiment 3 of the invention. As shown in FIG. 4, a burn-in test method according to the embodiment 3 is different from the burn-in test method of the embodiment 2 in that the Vcc voltage that is supplied from the pulsed power supply device 15 of the burn-in apparatus 1 to the semiconductor chip circuit (i.e., the semiconductor chip 10) is a pulse voltage ranging from a voltage that is higher than or equal to the threshold voltage Vth of the switching transistor T1 or the like to a burn-in voltage Vbi. In the embodiment 2, a certain time is needed for every load capacitor 35 to be charged or discharged when the Vcc voltage falls. In contrast, where the Vcc voltage is higher than or equal to Vth as shown in FIG. 4, the load capacitor 35 can be charged and discharged more easily. As a result, the frequency of the pulse voltage can be increased. Therefore, the current stress can be increased, which leads to increase in burn-in efficiency.

As described above, the embodiment 3 makes it possible to charge and discharge the load capacitor 35 more easily by varying the Vcc input voltage in pulse form in a range from a voltage that is higher than or equal to the threshold voltage Vth of the switching transistor T1 or the like to the burn-in voltage Vbi. As a result, the frequency of the pulse voltage can be increased. Therefore, the current stress can be increased, which leads to increase in burn-in efficiency.

Embodiment 4

Figure 5:
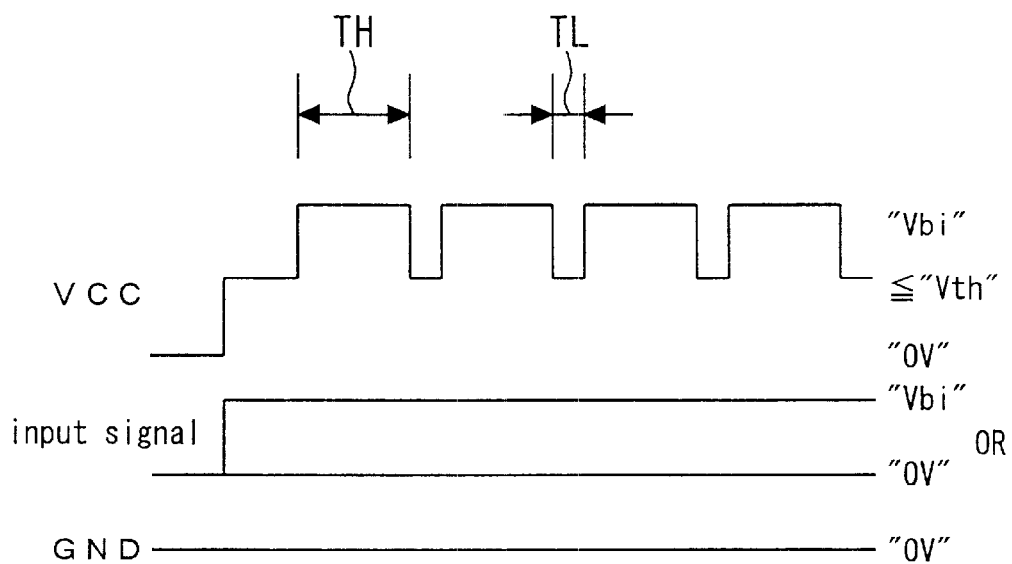
FIG. 5 is a time chart according to a embodiment 4 of the invention.

FIG. 5 is a time chart according to a embodiment 4 of the invention. As shown in FIG. 5, a burn-in test method according to the embodiment 4 is different from the burn-in test method of the embodiment 3 in that the Vcc voltage that is supplied from the pulsed power supply device 15 of the burn-in apparatus 1 to the semiconductor chip circuit (i.e., the semiconductor chip 10) is such that a high-voltage period $T_H$ of the pulse Vcc voltage is set longer than a low-voltage period $T_L$. The embodiment 4 is the same as the embodiment 3 in that the Vcc voltage is a pulse voltage ranging from a voltage that is higher than or equal to the threshold voltage Vth of the switching transistor T1 or the like to a burn-in voltage Vbi. Charge/discharge current stress occurs only in transition periods of rises and falls of Vcc input pulses. Therefore, the voltage stress imposition time can be elongated by increasing the high-voltage period $T_H$ of Vcc input pulses. As a result, the efficiency of a voltage-stress burn-in test can be increased without lowering the efficiency of a current-stress burn-in test, whereby the burn-in test time can be shortened.

As described above, the embodiment 4 makes it possible to elongate the voltage-stress imposition time by setting the high-voltage period $T_H$ of a Vcc input pulse waveform longer than the low-voltage period $T_L$. As a result, the efficiency of a voltage-stress burn-in test can be increased without lowering the efficiency of a current-stress burn-in test, whereby the burn-in test time can be shortened.

Embodiment 5

Figure 6:
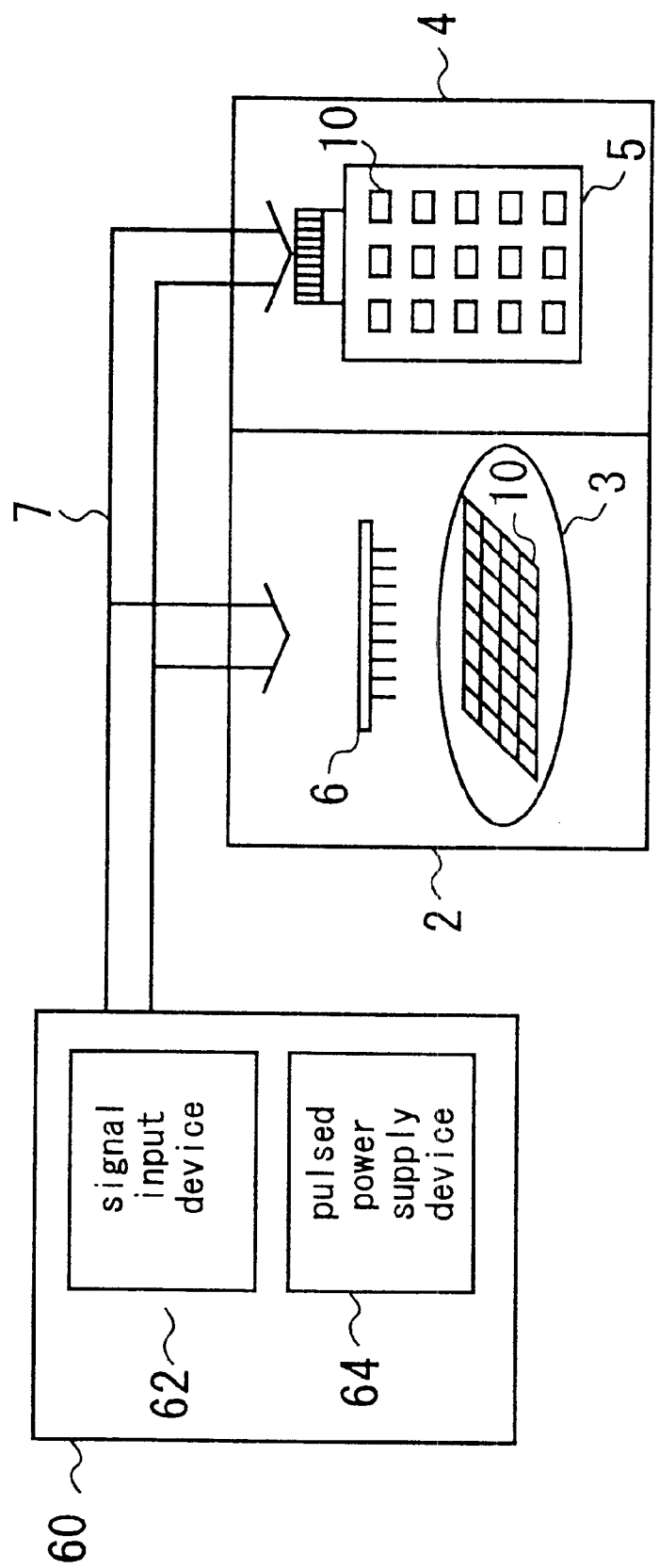
FIG. 6 shows a burn-in apparatus 60 according to a embodiment 5 of the invention.

FIG. 6 shows a burn-in apparatus 60 according to a embodiment 5 of the invention. As shown in FIG. 6, the burn-in apparatus 60 has a signal input device 62 that can supply a test pattern and a pulsed power supply device 64. In FIG. 6, the components that are given the same reference numerals as in FIG. 1 have the same functions as in FIG. 1 and hence will not be described below.

Figure 7:
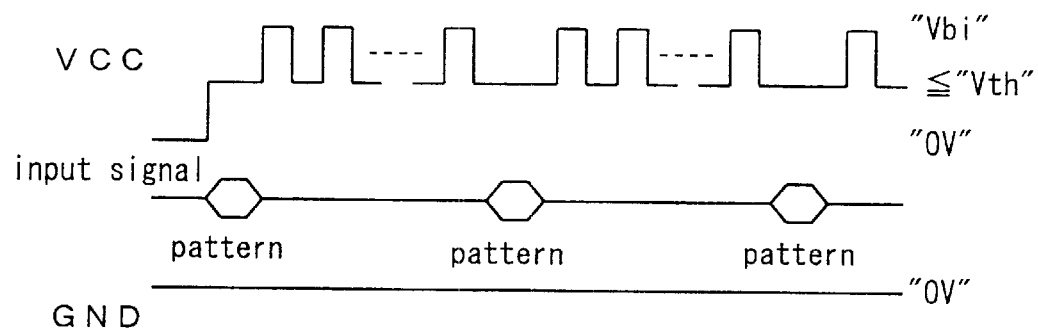
FIG. 7 is a time chart that is used in changing the internal state of each semiconductor chip 10 by causing the signal input device 62 to supply each semiconductor chip 10 with a test pattern as an input signal.

FIG. 7 is a time chart that is used in changing the internal state of each semiconductor chip 10 by causing the signal input device 62 to supply each semiconductor chip 10 with a test pattern as an input signal. A circuit of each semiconductor chip 10 can be the same as the circuit described in the embodiment 1 (see FIG. 3). For memory devices, the test pattern may be a combination pattern of an address signal and a data signal of a DRAM memory cell circuit. For logic ICs, the test pattern may be a pattern for setting various functions. However, the test pattern of the invention is not limited to such patterns. Where no input signal is supplied, the states of internal circuits are fixed to certain states and hence there may occur a case that only the fixed circuits are charged and discharged. In contrast, stress can be imposed on every circuit by always changing the internal states, whereby the efficiency of a burn-in test can further be increased.

As described above, the embodiment 5 makes it possible to impose stress to every circuit by changing the internal states of each semiconductor chip 10 by causing the signal input device 62 to supply the semiconductor chip 10 with a test pattern as an input signal before the pulsed power supply device 64 supplies the semiconductor chip 10 with a pulse voltage. Therefore, the efficiency of a burn-in test can further be increased.

Embodiment 6

A burn-in test method according to a embodiment 6 of the invention will be described below by using the burn-in apparatus 60 of the embodiment 1 and the time chart of FIG. 7 showing the waveforms of the power supply voltages and the signal. The semiconductor chip circuit of the embodiment 1 (see FIG. 3) is used as an example circuit of each semiconductor chip 10.

A test pattern as an input signal is supplied from the signal input device 62 of the burn-in apparatus 60 to each semiconductor chip 10. For memory devices, the test pattern may be a combination pattern of an address signal and a data signal of a DRAM memory cell circuit. For logic ICs, the test pattern may be a pattern for setting various functions. However, the test pattern of the invention is not limited to such patterns. The internal states of each semiconductor chip 10 supplied with the test pattern are changed in accordance with the test pattern.

The Vcc voltage is supplied from the pulsed power supply device 64 of the burn-in apparatus 60 to each semiconductor chip 10 whose internal states have been changed, so as to be varied in pulse form in a range from a voltage that is higher than or equal to the threshold voltage Vth to the burn-in voltage Vbi. The GND voltage to the semiconductor chip 10 is fixed at 0 V. In the semiconductor chip circuit 36, the received pulse Vcc voltage is supplied to the internal circuits 34 via the inverter circuit 33. The inverter circuit 33 charges the load capacitor 35 of each internal circuit 34 if the input signal is at Vbi and discharges it if the input signal is at 0 V. As a result, a current flows through the wiring that constitutes each internal circuit 34. Since every internal circuit 34 is supplied with the GND voltage, the supply of the pulse Vcc voltage allows current stress to be imposed on every internal circuit 34. This enables an efficient burn-in test.

As described above, the embodiment 6 makes it possible to impose stress to every circuit by changing the internal states of each semiconductor chip 10 by causing the signal input device 62 to supply the semiconductor chip 10 with a test pattern as an input signal before the pulsed power supply device 64 supplies the semiconductor chip 10 with a pulse voltage. Therefore, the efficiency of a burn-in test can further be increased.

Embodiment 7

Figure 8:
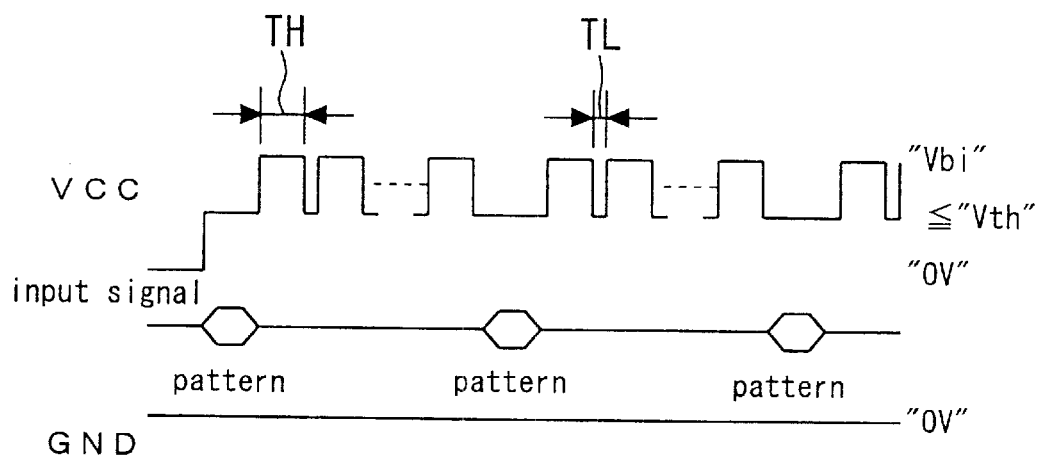
FIG. 8 is a time chart according to a embodiment 7 of the invention.

FIG. 8 is a time chart according to a embodiment 7 of the invention. As shown in FIG. 8, a burn-in test method according to the embodiment 7 is different from the burn-in test method of the embodiment 6 in that the Vcc voltage that is supplied from the pulsed power supply device 64 of the burn-in apparatus 60 to each semiconductor chip 10 whose internal states have been changed in accordance with the test pattern is such that a high-voltage period $T_H$ of the pulse Vcc voltage is set longer than a low-voltage period $T_L$. The voltage stress imposition time can be elongated by increasing the high-voltage period $T_H$ of Vcc input pulses. As a result, the voltage-stress imposition time can be elongated without lowering the efficiency of a current-stress burn-in test, whereby the efficiency of a voltage-stress burn-in test can be increased and the burn-in test time can be shortened.

As described above, the embodiment 7 makes it possible to elongate the voltage-stress imposition time by modifying the embodiment 6 in such a manner that the high-voltage period $T_H$ of a Vcc input pulse waveform is set longer than the low-voltage period $T_L$. As a result, the voltage stress imposition time can be elongated without lowering the efficiency of a current-stress burn-in test, whereby the efficiency of a voltage-stress burn-in test can be increased and the burn-in test time can further be shortened.

Embodiment 8

Figure 9:
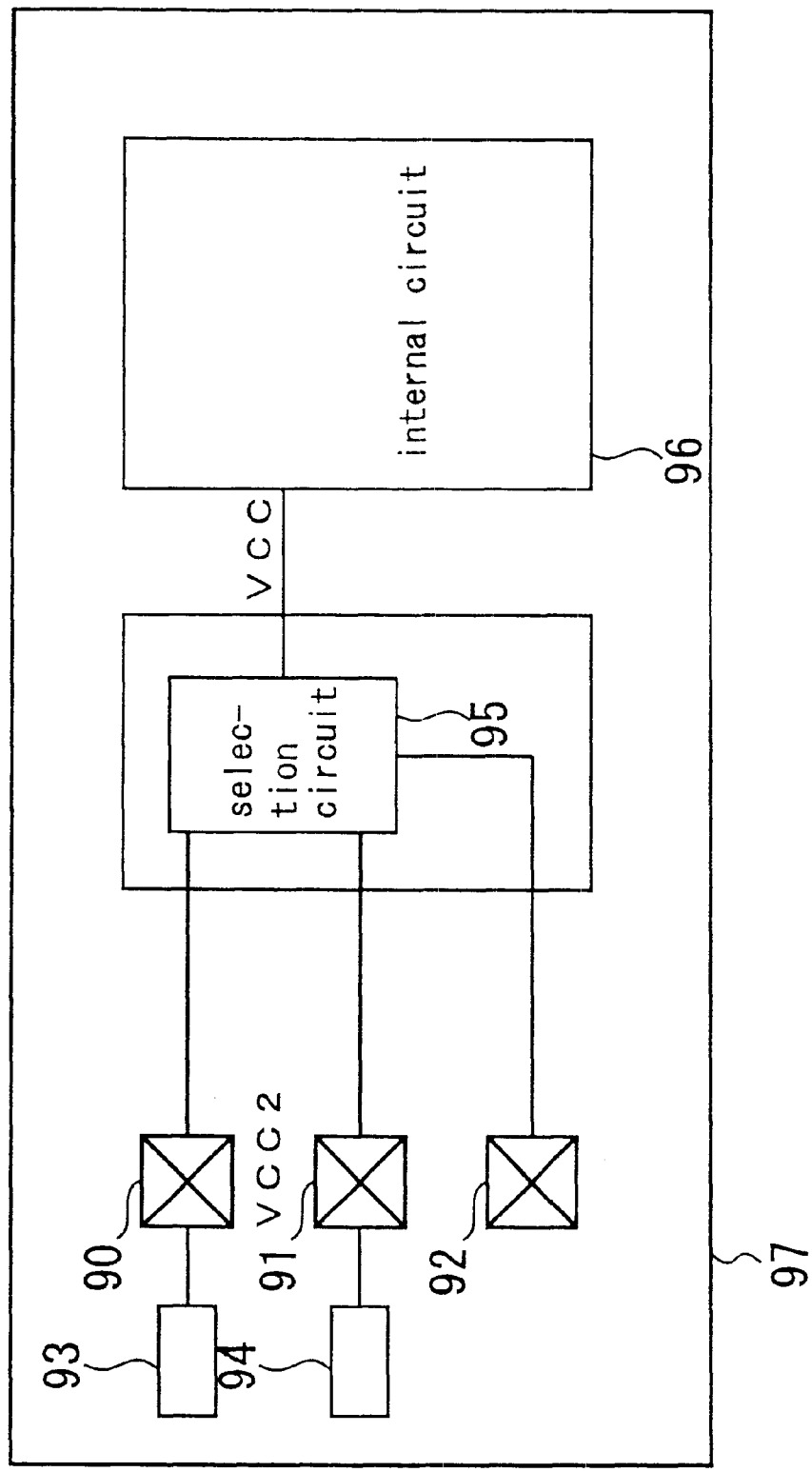
FIG. 9 schematically shows a semiconductor chip circuit according to an embodiment 8 of the invention.

FIG. 9 schematically shows a semiconductor chip circuit according to an embodiment 8 of the invention. As shown in FIG. 9, a semiconductor chip circuit 97 has two kinds of pulsed power supply devices 93 and 94, which are connected to a Vcc1 voltage pad 90 and a Vcc2 voltage pad 91, respectively. A selection circuit 95 selects a Vcc1 voltage or a Vcc2 voltage in accordance with a control signal that is input via a control signal pad 92, and supplies a selected voltage to internal circuits 96 as a Vcc voltage. In ordinary use, one of Vcc1 and Vcc2 is supplied to the internal circuits 96. Because the Vcc voltage is in pulse form, a load capacitor (not shown) that is constituted of a gate capacitance, a wiring capacitance, and a junction capacitance is charged (if the input signal is at Vbi) or discharged (if the input signal is at 0 V) at rises and falls of pulses, whereby a current flows through a wiring that constitute each internal circuit 96. Since every internal circuit 96 is supplied with the Vcc voltage and the GND voltage, the supply of the pulse Vcc voltage allows current stress to be imposed on every internal circuit 96. This enables an efficient burn-in test.

Figure 10:
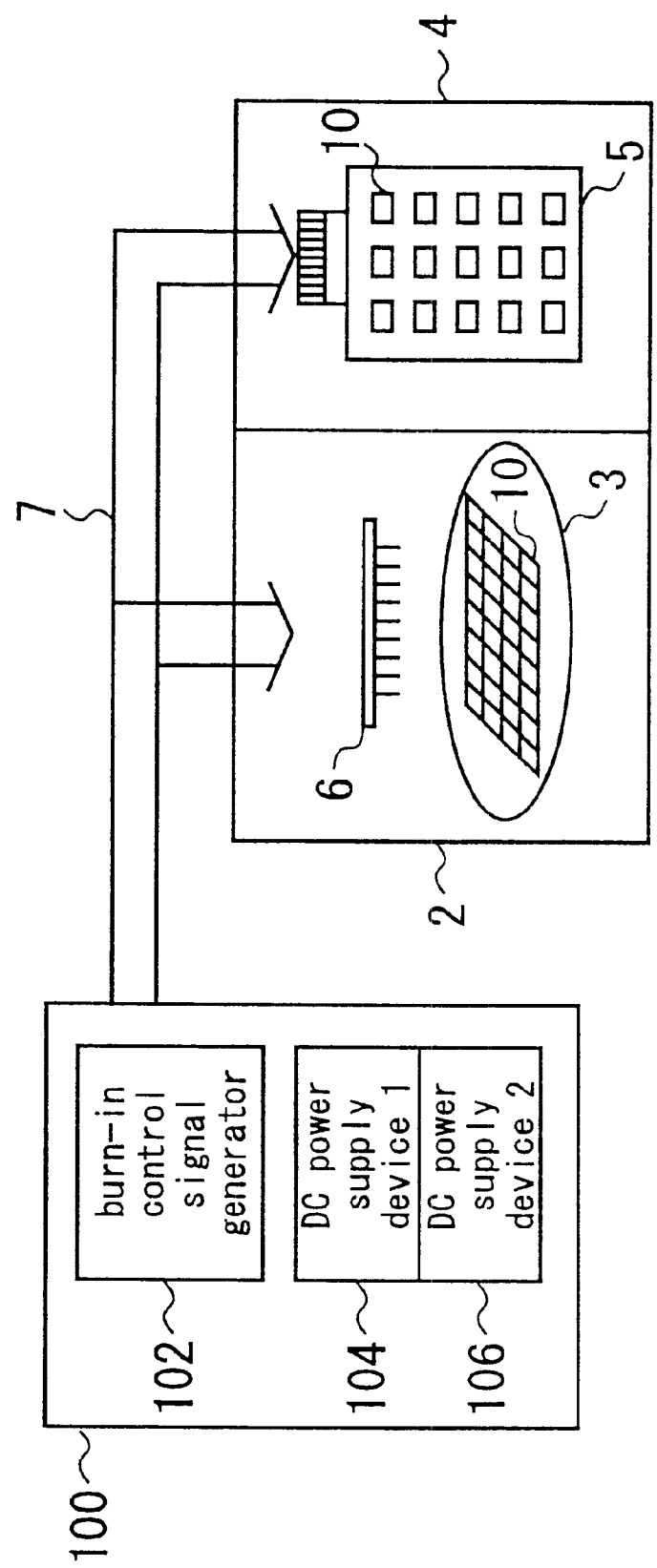
FIG. 10 shows a burn-in apparatus 100 for performing a burn-in test on the semiconductor chip 10 of FIG. 9.
Figure 11:
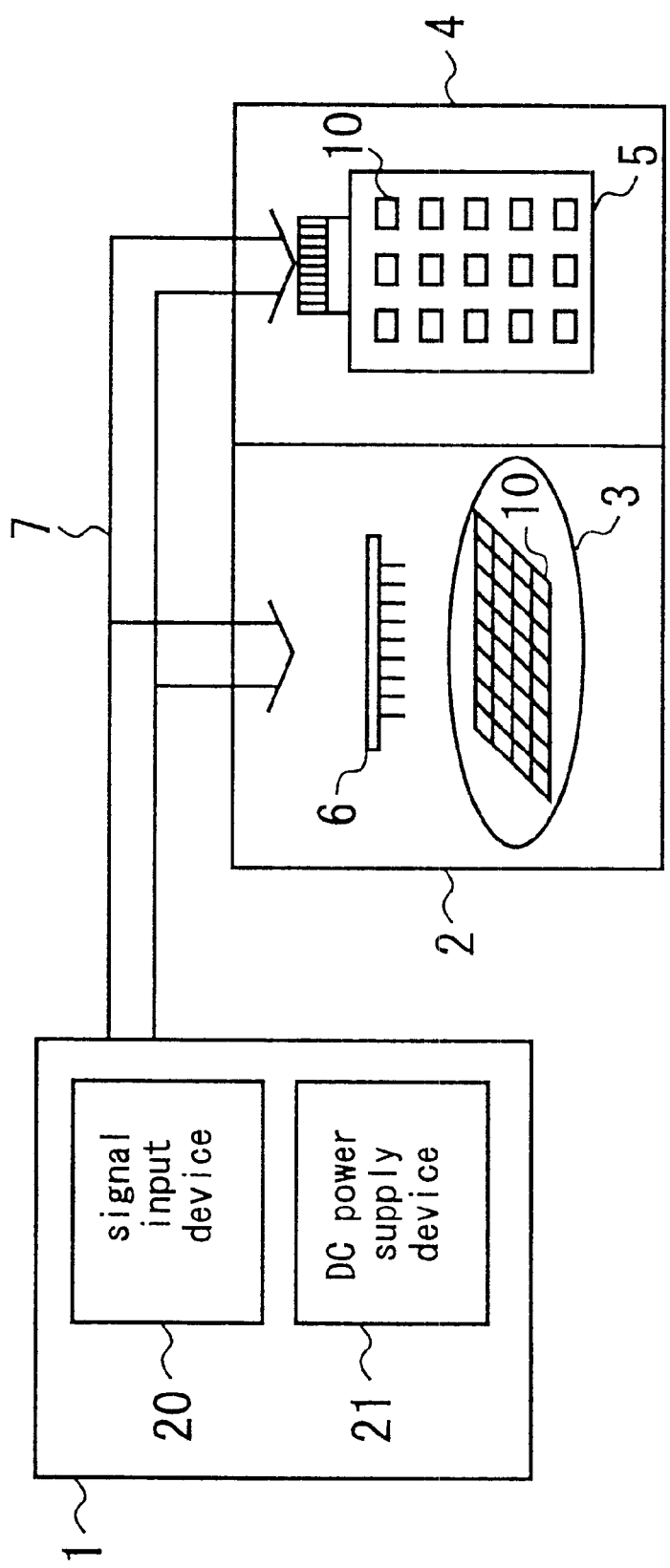
FIG. 11 shows a conventional burn-in test apparatus.
Figure 12:
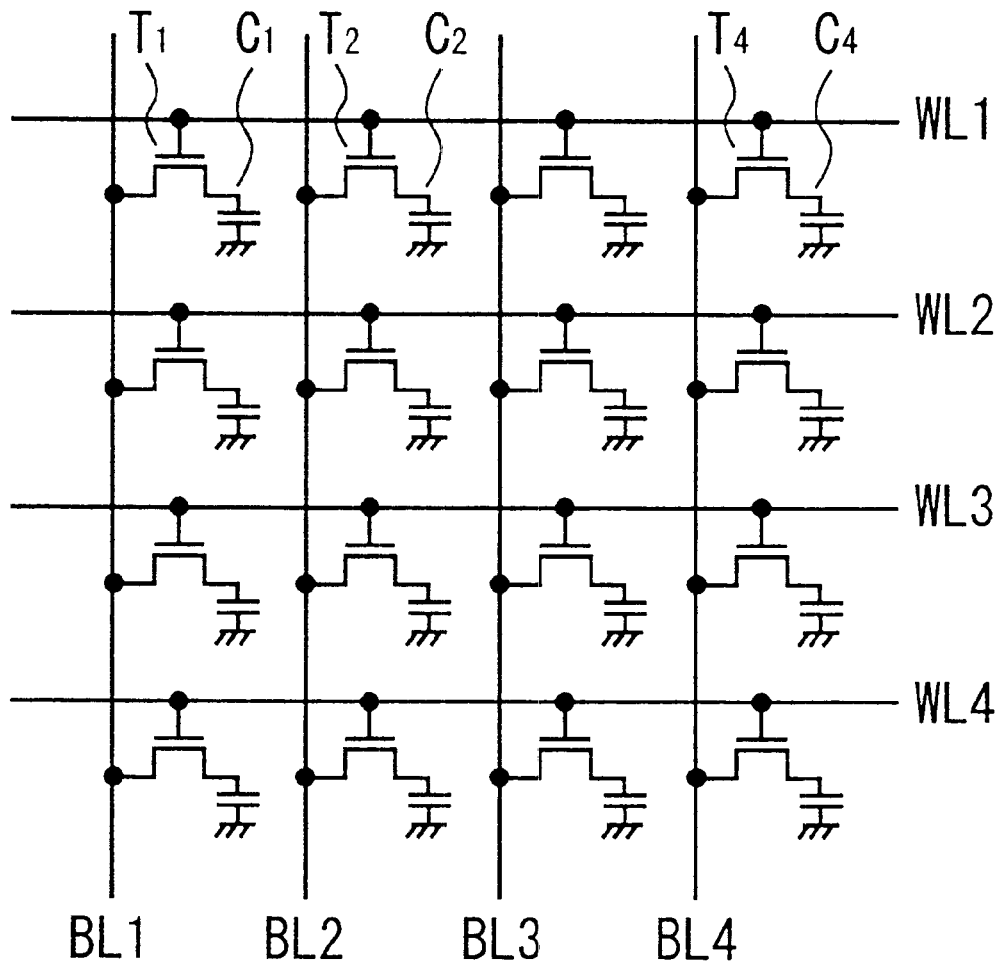
FIG. 12 is a circuit diagram of a DRAM memory cell circuit.

FIG. 10 shows a burn-in apparatus 100 for performing a burn-in test on the semiconductor chip 10 of FIG. 9. In FIG. 10, the components that are given the same reference numerals as in FIG. 1 have the same functions as in FIG. 1 and hence will not be described below. As shown in FIG. 10, the burn-in apparatus 100 has a burn-in control signal generation device (burn-in control signal generator) 102, a DC power supply device-1 104, and a DC power supply device-2 106, and supply a burn-in control signal and power supply voltages to the semiconductor chip 10. The burn-in control signal generation device 102 is connected to the control signal pad 92 shown in FIG. 9, and the DC power supply device-1 104 and the DC power supply device-2 106 are connected to the Vcc1 voltage pad 90 and the Vcc2 voltage pad 91 shown in FIG. 9, respectively. This configuration enables an inexpensive burn-in test with a small number of signals even it is a wafer-level test. The number of DC power supply devices shown in FIG. 10 is not limited to two and may be three or more. The number of power supply voltage pads shown in FIG. 9 varies depending on the number of DC power supply devices shown in FIG. 10.

As described above, in the embodiment 8, the semiconductor chip circuit 97 used in a burn-in test method has plural kinds of pulsed power supply devices 93 and 94, a desired kind of power supply voltage is selected by using a control signal that is input via the control signal pad 92, and the selected power supply voltage can be supplied to the internal circuits 96 as Vcc. This enables an inexpensive burn-in test with a small number of signals even if it is a wafer-level test.

Embodiment 9

A burn-in test method according to a embodiment 9 of the invention will be described below by using the burn-in apparatus 100 and the semiconductor chip circuit 97 of the embodiment 8.

The DC power supply device-1 104 and the DC power supply device-2 106 of the burn-in apparatus 100 supply DC power supply voltages to the Vcc1 voltage pad 90 and the Vcc2 voltage pad 91, respectively, of the semiconductor chip circuit 97. The burn-in control signal generation circuit 102 of the burn-in apparatus 100 supplies a control signal to the selection circuit 95 of the semiconductor chip circuit 97. The two kinds of DC power supply voltages that are supplied to the Vcc1 voltage pad 90 and the Vcc2 voltage pad 91 are added to pulse power supply voltages that are output from the two kinds of pulsed power supply devices 93 and 94 provided in the semiconductor chip circuit 97, respectively. One of resulting two kinds of DC-added pulse voltages is selected in accordance with a control signal that is supplied to the selection circuit 95, and then supplied to the internal circuits 96 as a power supply voltage Vcc. Since every internal circuit 96 is supplied with the Vcc voltage and the GND voltage, the supply of the pulse Vcc voltage allows current stress to be imposed on every internal circuit 96. This enables an efficient burn-in test.

The number of DC power supply devices shown in FIG. 10 is not limited to two and may be three or more. The number of power supply voltage pads shown in FIG. 9 varies depending on the number of DC power supply devices shown in FIG. 10.

As described above, in the embodiment 9, the semiconductor chip circuit 97 used in a burn-in test method has plural kinds of pulsed power supply devices 93 and 94, a desired kind of power supply voltage is selected by using a control signal that is input via the control signal pad 92, and the selected power supply voltage can be supplied to the internal circuits 96 as Vcc. This enables an inexpensive burn-in test with a small number of signals even if it is a wafer-level test.

Embodiment 10

A burn-in test apparatus according to a 10th embodiment is different from the burn-in test apparatus of the first or embodiment 8 in that the Vcc voltage or the Vcc1 voltage and the like that are supplied from the pulsed power supply device 15 of the burn-in apparatus 1 or the pulsed power supply device 93 and the like in the semiconductor chip circuit 97 are a pulse voltage ranging from a voltage that is higher than or equal to the threshold voltage Vth of the switching transistor T1 or the like to a burn-in voltage Vbi (see FIG. 4). The application of the Vcc voltage or the like that is higher than or equal to Vth allows the load capacitor 35 or the like to be charged and discharged more easily. As a result, the frequency of the pulse voltage can be increased. Therefore, the current stress can be increased, which leads to increase in burn-in efficiency.

As described above, the embodiment 10 makes it possible to charge and discharge the load capacitor 35 or the like more easily by varying the Vcc voltage in pulse form in a range from a voltage that is higher than or equal to the threshold voltage Vth of the switching transistors T1 or the like to the burn-in voltage Vbi. As a result, the frequency of the pulse voltage can be increased. Therefore, the current stress can be increased, which leads to increase in burn-in efficiency.

Embodiment 11

A burn-in test apparatus according to an 11th embodiment is different from the burn-in test apparatus of the 10th embodiment in that the Vcc voltage or the Vcc1 voltage and the like that are supplied from the pulsed power supply device 15 of the burn-in apparatus 1 or the pulsed power supply device 93 and the like in the semiconductor chip circuit 97 are such that a high-voltage period $T_H$ of the pulse Vcc voltage or the like is set longer than a low-voltage period $T_L$. Charge/discharge current stress occurs only in transition periods of rises and falls of Vcc input pulses. Therefore, the voltage stress imposition time can be elongated by increasing the high-voltage period $T_H$ of Vcc input pulses. As a result, the efficiency of a voltage-stress burn-in test can be increased without lowering the efficiency of a current-stress burn-in test, whereby the burn-in test time can be shortened.

As described above, the 11th embodiment makes it possible to elongate the voltage-stress imposition time by setting the high-voltage period $T_H$ of a Vcc input pulse waveform longer than the low-voltage period $T_L$. As a result, the efficiency of a voltage-stress burn-in test can be increased without lowering the efficiency of a current-stress burn-in test, whereby the burn-in test time can be shortened.

As described above, the invention provides a burn-in test method and apparatus and a semiconductor chip to be used in a burn-in test method that allow current stress to be imposed on every circuit node by varying a power supply voltage in pulse form, and thereby enables an efficient burn-in test.

In the burn-in test method, in the pulse voltage supplying step, the pulse voltage may be varied in a range from a voltage that is higher than or equal to a threshold voltage of the semiconductor chip to the burn-in voltage.

In the burn-in test method, in the pulse voltage supplying step, the pulse voltage may have a pulse waveform in which a high-voltage period is longer than a low-voltage period.

Here, the burn-in test method may further comprise, prior to the pulse voltage supplying step, a step of supplying a test pattern for changing an internal state of the semiconductor chip.

In the burn-in test apparatus, the pulse voltage may be varied in pulse form in a range from a voltage that is higher than or equal to a threshold voltage of the semiconductor chip to the burn-in voltage.

In the burn-in test apparatus, the pulse voltage may have a pulse waveform in which a high-voltage period is longer than a low-voltage period.

In the burn-in test apparatus, the burn-in apparatus may supply a test pattern for changing an internal state of the semiconductor chip.

The present invention has been described in detail with respect to various embodiments, and it will now be apparent from the foregoing to those skilled in the art that changes and modifications may be made without departing from the invention in its broader aspects, and it is the invention, therefore, in the appended claims to cover all such changes and modifications as fall within the true spirit of the invention.

The entire disclosure of Japanese Patent Application No. 10-346829 filed on Dec. 7, 1998 including specification, claims, drawings and summary are incorporated herein by reference in its entirety.

What is claimed is:

1. A burn-in test apparatus for examining all of the internal circuits of a semiconductor chip in an accelerated life test, the apparatus comprising:

a burn-in apparatus having a pulsed power supply device for supplying a pulse voltage that varies in pulse from in a range from 0V to a burn-in voltage; and configured for testing a semiconductor chip that is supplied with the pulse voltage from the pulsed power supply device, wherein said semiconductor chip has an internal circuit and a load capacitor in said internal circuit, said internal circuit being given current stress in such a manner that a current is caused to flow through said internal circuit by charging said load capacitor when a voltage of the power supply supplied to said semiconductor chip is at a predetermined burn-in voltage, and discharging said load capacitor when the voltage of the power supply is at 0 V, the current stress being imposed on all of said internal circuits of the semiconductor chip.

2. The burn-in test apparatus according to claim 1, wherein the pulse voltage is varied in pulse form in a range from a voltage that is higher than or equal to a threshold voltage of said semiconductor chip to the burn-in voltage.

3. The burn-in test apparatus according to claim 2, wherein the pulse voltage has a pulse waveform in which a high-voltage period is longer than a low-voltage period.

4. The burn-in test apparatus according to claim 3, wherein said burn-in apparatus supplies a test pattern for changing an internal state of the semiconductor chip.

5. The burn-in test apparatus according to claim 1, wherein said burn-in apparatus supplies a test pattern for changing an internal state of said semiconductor chip.

6. The burn-in test apparatus according to claim 2, wherein said burn-in apparatus supplies a test pattern for changing an internal state of the semiconductor chip.

7. A burn-in test apparatus for examining all of internal circuits of a semiconductor chip in an accelerated life test, the apparatus comprising:

a burn-in apparatus having:
  a plurality of DC power supply devices for supplying respective DC voltage; and
  a burn-in control signal generation device for generating a burn-in control signal to be used for selecting one of said DC power supply device; and configured for testing a semiconductor chip that is supplied with the DC voltages from said respective DC power supply device, said semiconductor chip having:
  a plurality of pulsed power supply devices for supplying respective pulse voltages that vary in pulse from in a range from 0 V to a predetermined burn-in voltage;
  an addition section for generating a plurality of pulse supply voltages by adding the DC voltages to the pulse voltages, respectively;
  a selection circuit for selecting one of the pulse supply voltages generated by said addition section in accordance with the burn-in control signal; and
  an internal circuit including a load capacitor, wherein the internal circuit is given current stress in such a manner that a current is caused to flow through said internal circuit by charging said load capacitor by using the selected pulse supply voltage when a voltage of the power supply supplied to said semiconductor chip is at the burn-in control voltage, and discharging said load capacitor by using the pulse supply voltage when the voltage of the power supply is at 0 V, the current stress being imposed on all of said internal circuits of the semiconductor chip.

8. The burn-in test apparatus according to claim 7, wherein the pulse voltage is varied in pulse form in a range from a voltage that is higher than or equal to a threshold voltage of said semiconductor chip to the burn-in voltage.

9. The burn-in test apparatus according to claim 8, wherein the pulse voltage has a pulse waveform in which a high-voltage period is longer than a low-voltage period.

10. The burn-in test apparatus according to claim 9, wherein said burn-in apparatus supplies a test pattern for changing an internal state of said semiconductor chip.

11. The burn-in test apparatus according to claim 7, wherein said burn-in apparatus supplies a test pattern for changing an internal state of said semiconductor chip.

12. The burn-in test apparatus according to claim 8, wherein said burn-in apparatus supplies a test pattern for changing an internal state of said semiconductor chip.

* * * * *